(12) United States Patent
Ziemkus

(10) Patent No.: US 9,390,365 B2
(45) Date of Patent: Jul. 12, 2016

(54) INTEGRATED CIRCUIT MODULE FOR A DUAL-INTERFACE SMART CARD

(71) Applicant: American Banknote Corporation, Fort Lee, NJ (US)

(72) Inventor: Thomas Ziemkus, Harleysville, PA (US)

(73) Assignee: AMERICAN BANKNOTE CORPORATION, Fort Lee, NJ (US)

( * ) Notice: Subject to any disclaimer, the term of this patent is extended or adjusted under 35 U.S.C. 154(b) by 0 days.

(21) Appl. No.: 14/683,551

(22) Filed: Apr. 10, 2015

(65) Prior Publication Data

US 2015/0294213 A1 Oct. 15, 2015

Related U.S. Application Data

(60) Provisional application No. 61/977,923, filed on Apr. 10, 2014.

(51) Int. Cl.
*G06K 19/06* (2006.01)
*G06K 19/077* (2006.01)
*H01L 23/498* (2006.01)
*H01L 23/31* (2006.01)

(52) U.S. Cl.
CPC .... *G06K 19/07754* (2013.01); *G06K 19/07769* (2013.01); *H01L 23/49855* (2013.01); *H01L 23/3121* (2013.01); *H01L 2224/48091* (2013.01); *H01L 2224/48227* (2013.01); *H01L 2224/48228* (2013.01); *H01L 2224/49109* (2013.01); *H01L 2224/49171* (2013.01); *H01L 2224/73265* (2013.01); *H01L 2924/181* (2013.01); *H01L 2924/19107* (2013.01)

(58) Field of Classification Search
CPC .............. G06K 19/07754; G06K 19/07722; G06K 19/07749; G06K 19/07769; G06K 19/07745; G06K 19/07747; G06K 19/07794; G06K 19/077; G06K 19/0775; G06K 19/07752; G06K 19/07773; G06K 19/07783; H01L 23/4985
USPC .......... 235/492, 380, 493, 449, 486, 487, 488
See application file for complete search history.

(56) References Cited

U.S. PATENT DOCUMENTS

| 5,671,525 A | 9/1997 | Fidalgo |
| 6,881,605 B2 | 4/2005 | Lee et al. |
| 7,387,259 B2 | 6/2008 | Thevenot |
| 8,640,965 B2 | 2/2014 | Sutera |

(Continued)

*Primary Examiner* — Thien M Le
(74) *Attorney, Agent, or Firm* — Kriegsman & Kriegsman

(57) ABSTRACT

An integrated circuit (IC) module for a dual-interface smart card includes a planar, non-conductive module tape that is plated on its top surface to define a plurality of conductive contact pads. An IC chip is mounted on the bottom surface of the module tape and is electrically connected to each of the contact pads by a wire, the underside of each contact pad being exposed for bonding with the wire by punching a hole through the tape. The IC chip and wires are protected by an encapsulant. A pair of the contact pads, which are not required to transmit signals through direct contact, is designated as antenna contact pads. Accordingly, a hole is punched through the module tape in alignment with each antenna contact pad outside the region of the encapsulant, thereby rendering the underside of the antenna pads available for connection to an antenna by a conductive element.

16 Claims, 8 Drawing Sheets

(56) References Cited

U.S. PATENT DOCUMENTS

| | | | |
|---|---|---|---|
| 2005/0212690 A1 | 9/2005 | Nishikawa | |
| 2006/0139901 A1 | 6/2006 | Meireles | |
| 2009/0151150 A1* | 6/2009 | Ayala | H05K 3/321 29/600 |
| 2011/0011939 A1* | 1/2011 | Seah | G06K 19/07749 235/492 |
| 2011/0084145 A1* | 4/2011 | Tolentino | G06K 19/077 235/492 |
| 2012/0248201 A1* | 10/2012 | Sutera | G06K 19/07728 235/492 |
| 2015/0269472 A1* | 9/2015 | Finn | G06K 19/07747 235/492 |
| 2015/0269474 A1* | 9/2015 | Finn | G06K 19/07754 235/492 |
| 2015/0278674 A1* | 10/2015 | Schoengrundner | G06K 19/07769 235/492 |

* cited by examiner

INTEGRATED CIRCUIT MODULE FOR A DUAL-INTERFACE SMART CARD

FIELD OF THE INVENTION

The present invention relates generally to smart cards and, more particularly, to integrated circuit modules for dual-interface smart cards.

BACKGROUND OF THE INVENTION

Smart cards are well known devices that include a card body into which is embedded an integrated circuit (IC) module. The integrated circuit module includes an integrated circuit chip that is designed to store data that can be used, inter alia, to provide the card with electronic identification, authentication, data storage and application processing capabilities. As a result, smart cards, which are also commonly referred to as integrated circuit cards or chip cards, are widely used in commerce to provide information and/or application processing capabilities in connection with, but not limited to, bank cards, credit cards, health insurance cards, driver's licenses, transportation cards, loyalty cards and membership cards.

Smart cards of the type as described above transmit data stored on the integrated circuit module using either (i) a direct contact interface (the resultant products being commonly referred to in the art as contact smart cards), (ii) a contact-free interface (the resultant products being commonly referred to in the art as contactless smart cards) or (ii) a hybrid of the two aforementioned interfaces (the resultant products being commonly referred to in the art as dual-interface smart cards).

Dual-interface smart cards utilize an integrated circuit module that is specifically designed to allow for the transmission of signals through either a direct contact or a contact-free interface, this type of module often being referred to in the art as a dual-interface IC module. Referring now to FIGS. 1(a) and 1(b), there are shown front and rear plan views, respectively, of a segment of an IC module reel 11 that includes a plurality of individual dual-interface IC modules 13 arranged in pairs in a side-by-side relationship, each module 13 being punched, or otherwise separated, from reel 11 upon completion of assembly. As can be appreciated, the fabrication of IC modules 13 from a continuous reel 11 greatly facilitates the manufacturing process.

Reel 11 comprises a module tape 15 that not only serves as the principal carrier for reel 11 but also serves as the substrate for each individual module 13. Tape 15 is a thin, continuous, ribbon-type strip constructed of a non-conductive material, such as a glass epoxy, that has a generally flat top surface 15-1 and a generally flat bottom surface 15-2.

As seen most clearly in FIGS. 1(a) and 2, top surface 15-1 of tape 15 is plated to define a plurality of separate contact pads 17-1 thru 17-8 within the footprint of each module 13, each contact pad 17 being constructed of a highly conductive material, such as gold-plated or nickel-plated copper. The particular size, shape and arrangement of contact pads 17 for each module 13 are largely defined by International Organization for Standardization (ISO) standards for the manufacture of smart cards and together provide a total surface area of approximately 1 square centimeter. In use, contact pads 17 enable each module 13 to interface with an appropriate card reader by means of direct contact, with certain contact pads 17 designated to transmit particular signal components (e.g. input/output signal, clock signal, power, etc.).

As seen most clearly in FIGS. 1(b) and 2, an integrated circuit chip 19 is mounted on bottom surface 15-2 by an adhesive 21 at the approximate midpoint within the footprint of each module 13. An arrangement of holes 23-1 thru 23-8 is punched transversely through tape 15 in a spaced-apart, circular arrangement around IC chip 19. It is to be understood that holes 23-1 thru 23-8 are specifically positioned to provide direct access to the underside of contact pads 17-1 thru 17-8, respectively. In this manner, a conductive wire (e.g. a gold-plated wire) 25 can be fed through each hole 23 and bonded, at its ends, to IC chip 19 and its corresponding contact pad 17 to establish an electrical path therebetween. As a result, data stored on IC chip 19 can be transmitted through wires 25, to selected contact pads 17 and ultimately received by a card reader (not shown) in contact therewith.

An encapsulation material, or encapsulant, 27 is commonly deposited as a generally semi-spherical mass over IC chip 19 as well as any wires 25. Encapsulant 27 is preferably constructed of a rigid and durable material, such as a hard epoxy resin, that serves to protect the relatively sensitive electrical components and ensure that adequate connectivity is maintained.

Additionally, bottom surface 15-2 of tape 15 is plated to define a pair of antenna contact pads 29-1 and 29-2 within the footprint of each module 13, each antenna contact pad 29 being constructed of a highly conductive material, such as gold-plated or nickel-plated copper. Antenna contact pads 29 are located on opposing sides of module 13 and are connected to IC chip 19 by corresponding conductive wires 31 to establish an electrical path therebetween.

As can be seen, each conductive wire 31 and a portion of its corresponding contact pad 29 are protected by encapsulant 27. At the same time, a portion of antenna contact pads 29 extends beyond the periphery of encapsulant 27 and is thereby rendered externally exposed for connection to an antenna embedded in the card body.

In use, the antenna provides non-contact means for transmitting communication signals between integrated circuit module 13 and an associated card reader. The antenna is commonly constructed as a conductive wire that is arranged in a coiled, or spiraled, configuration within the card body. Each free end of the wire is often arranged into a dense configuration, such as a tightly wrapped coil, spiral, W-shape, or zig-zag formation, to form a suitable contact terminal.

To achieve functionality of the smart card, the IC module needs to be coupled to the antenna. Traditionally, the integrated circuit module is connected to the antenna through either direct connection or inductive coupling.

Direct connection relies upon connecting a conductive element (e.g. a wire, conductive epoxy or combination thereof) between the antenna contact pads on the IC module and the contact terminals for the antenna. However, in order to directly connect the antenna contact pads on the IC module to the contact terminals of the antenna, a cavity is typically milled in the card body to a depth that is sufficient to at least partially expose the antenna contact terminals.

With the contact terminals for the antenna exposed, direct connection is commonly achieved between the antenna and the IC module using a variety of different connection techniques.

As an example, in U.S. Pat. No. 8,640,965 to C. M. Sutera, the disclosure of which is incorporated herein by reference, there is shown a dual-interface smart card that electrically connects an IC module to exposed sections of an antenna using a pair of opposing, stapled-shaped, conductive elements, with one conductive element being permanently welded to a contact pad on the IC module and the other conductive element being permanently welded to the antenna. Each conductive element includes a pair of resilient spring arms that maintain electrical connection between the contact pad and the antenna even upon movement of the IC module relative to the card body. To provide further redundancy of connection between each contact pad and the antenna, the resilient spring arms of the opposing conductive elements are encapsulated with a supply of conductive filler material.

As another example, in U.S. Pat. No. 6,881,605 to C. K. Lee, the disclosure of which is incorporated herein by reference, there is disclosed a method of forming a dual-interface smart card that establishes connection between an IC and an antenna coil by pulling out the two free ends of the antenna coil from the core sheet, and securing each of the extracted free ends of the antenna to the integrated circuit, for example, by soldering or thermocompression bonding.

As referenced above, dual-interface IC modules are conventionally constructed by plating both sides of the module tape, this type of module tape being referred to herein as having a double side plated module tape construction. By plating both sides of the module tape, the resultant IC module is provided with a first set of contact pads on its top surface that allow for direct contact signal transmission to an appropriate card reader and a second set of contact pads on its bottom surface that serve as points of connection between the IC module and an antenna embedded in the card body, the antenna allowing for contact-free signal transmission to an appropriate card reader.

Dual-interface IC modules that rely upon a double side plated module tape construction have been found to suffer from a notable drawback. Specifically, a significant number of processing steps (e.g. layer deposition, patterned light exposure, and chemical developing) and a substantial amount of materials are required in order to plate both sides of the module tape, resulting in an IC module that is relatively expensive to manufacture. In fact, dual-interface IC modules, which typically utilize a double side plated module tape construction, are often as much as 40% more expensive to manufacture than IC modules used in contact smart cards, which typically utilize a single side plated module tape construction.

SUMMARY OF THE INVENTION

It is an object of the present invention to provide a new and improved integrated circuit module for a dual-interface smart card.

It is another object of the present invention to provide an integrated circuit module of the type as described above that includes an upper set of contact pads that allow for direct contact signal transmission to an appropriate card reader.

It is yet another object of the present invention to provide an integrated circuit module of the type as described above that includes means for directly connecting to an antenna embedded in a card body, the antenna allowing for contact-free signal transmission to an appropriate card reader.

It is still another object of the present invention to provide an integrated circuit module of the type as described above that has a limited number of parts, is inexpensive to manufacture, and is easy to use.

Accordingly, as one feature of the present invention, there is provided an integrated circuit module for a dual-interface smart card, comprising (a) a non-conductive module tape having a top surface and a bottom surface, the non-conductive module tape being transversely punched to define a first hole and a second hole, the first and second holes being mutually exclusive, (b) a first conductive contact pad plated on the top surface of the module tape (c) an integrated circuit chip coupled to the bottom surface of the module tape, the integrated circuit chip having multiple sides, and (d) a conductive element extending through the first hole and electrically connecting the integrated circuit chip to the first contact pad, (e) wherein the second hole exposes a portion of the first contact pad as a surface for establishing electrical connection to the integrated circuit chip.

As another feature of the present invention, there is provided a dual-interface smart card, comprising (a) a card body comprising an antenna, (b) an integrated circuit module comprising (i) a non-conductive module tape having a top surface and a bottom surface, the non-conductive module tape being transversely punched to define a first hole and a second hole, the first and second holes being mutually exclusive, (ii) a first conductive contact pad plated on the top surface of the module tape, (iii) an integrated circuit chip coupled to the bottom surface of the module tape, and (iv) a first conductive element extending through the first hole and electrically connecting the integrated circuit chip to the first contact pad, and (c) a second conductive element extending through the second hole in the module tape and electrically connecting the antenna in the card body to the first contact pad.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts.

DETAILED DESCRIPTION OF THE INVENTION

Figure 1A:
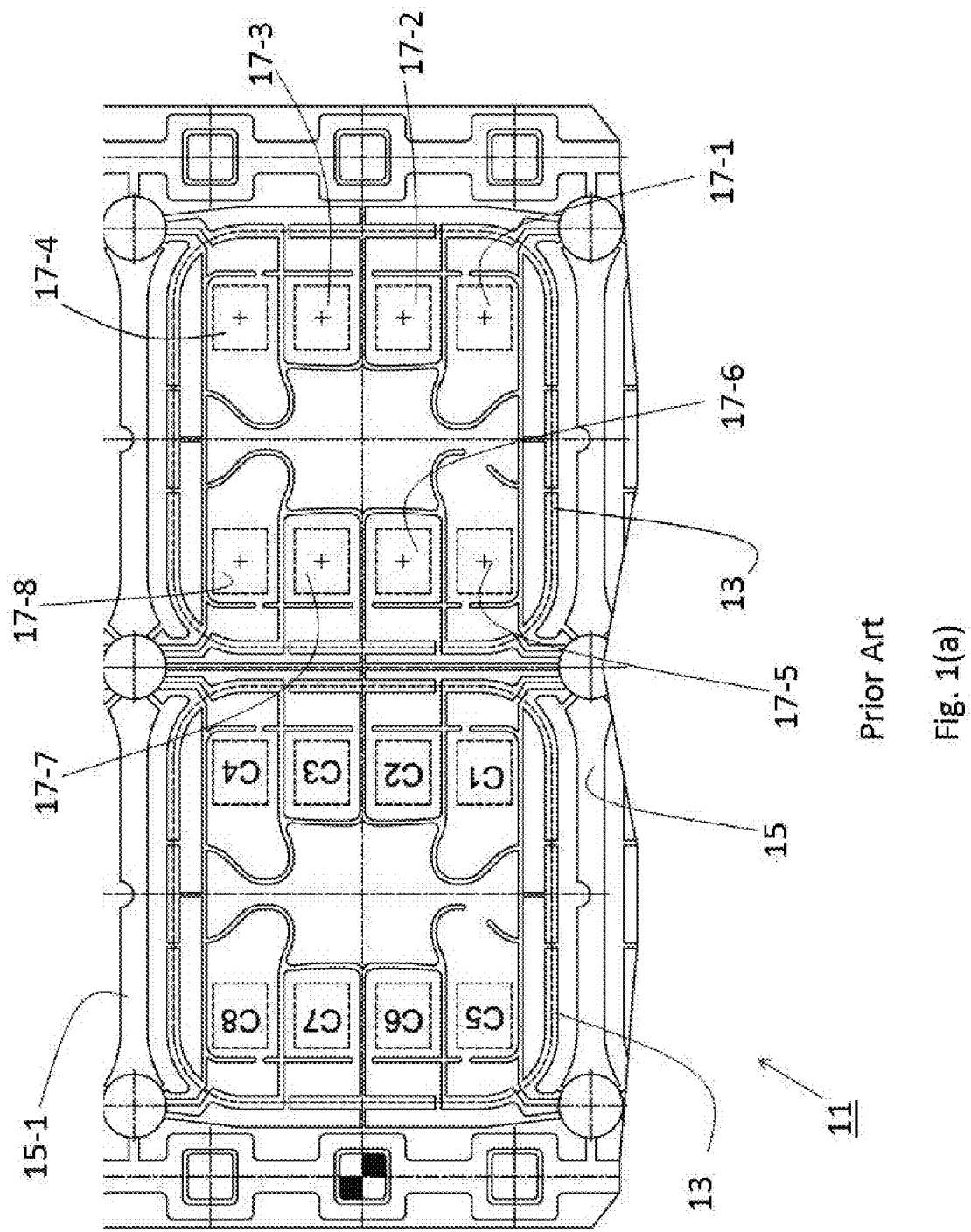
FIGS. 1(a) and 1(b) are fragmentary, top and bottom plan views, respectively, of a segment of an IC module reel that includes a plurality of individual dual-interface IC modules that are known in the art, the periphery of each dual-interface IC module being shown in dashed form.
Figure 1B:
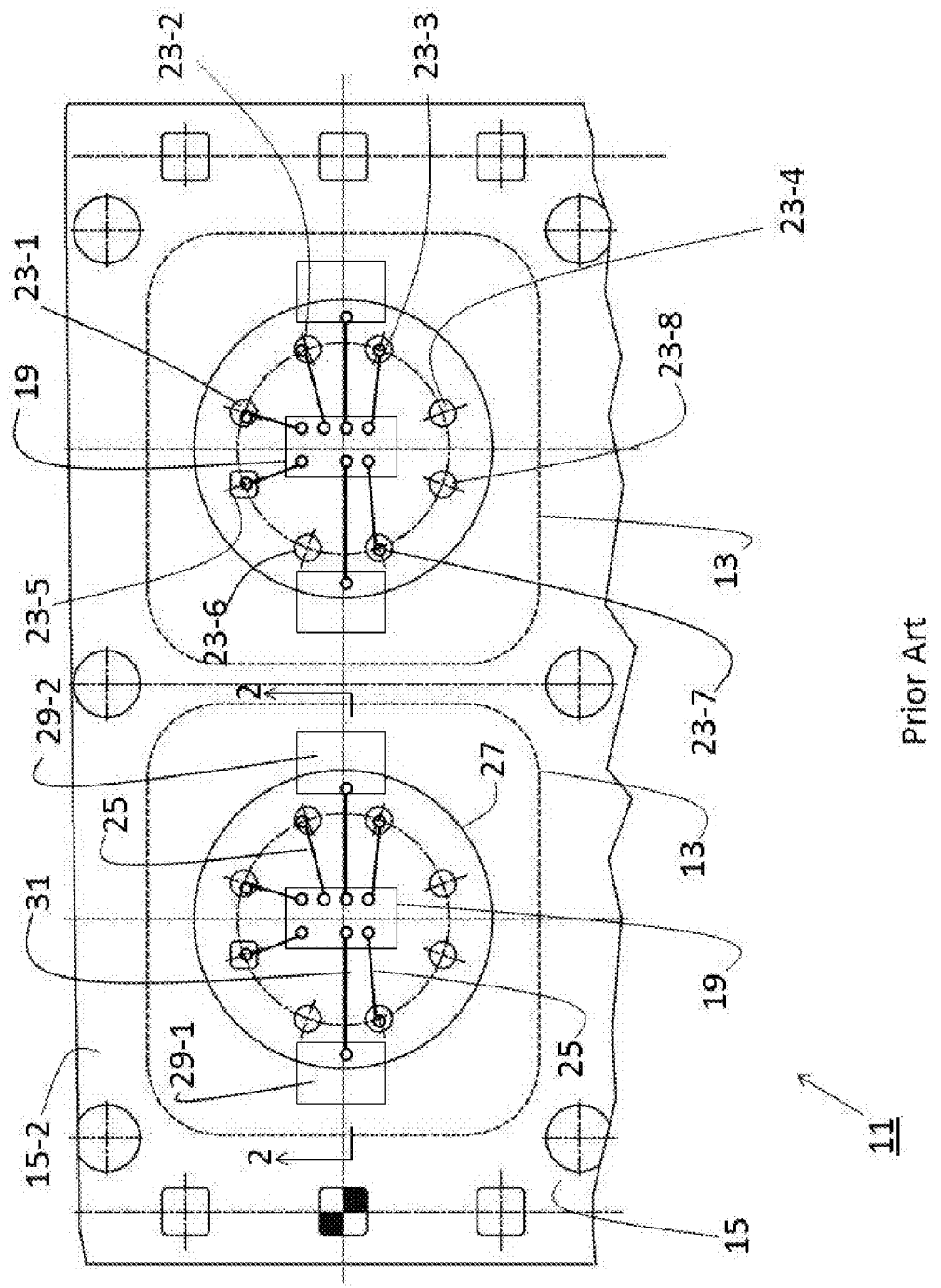
Figure 2:
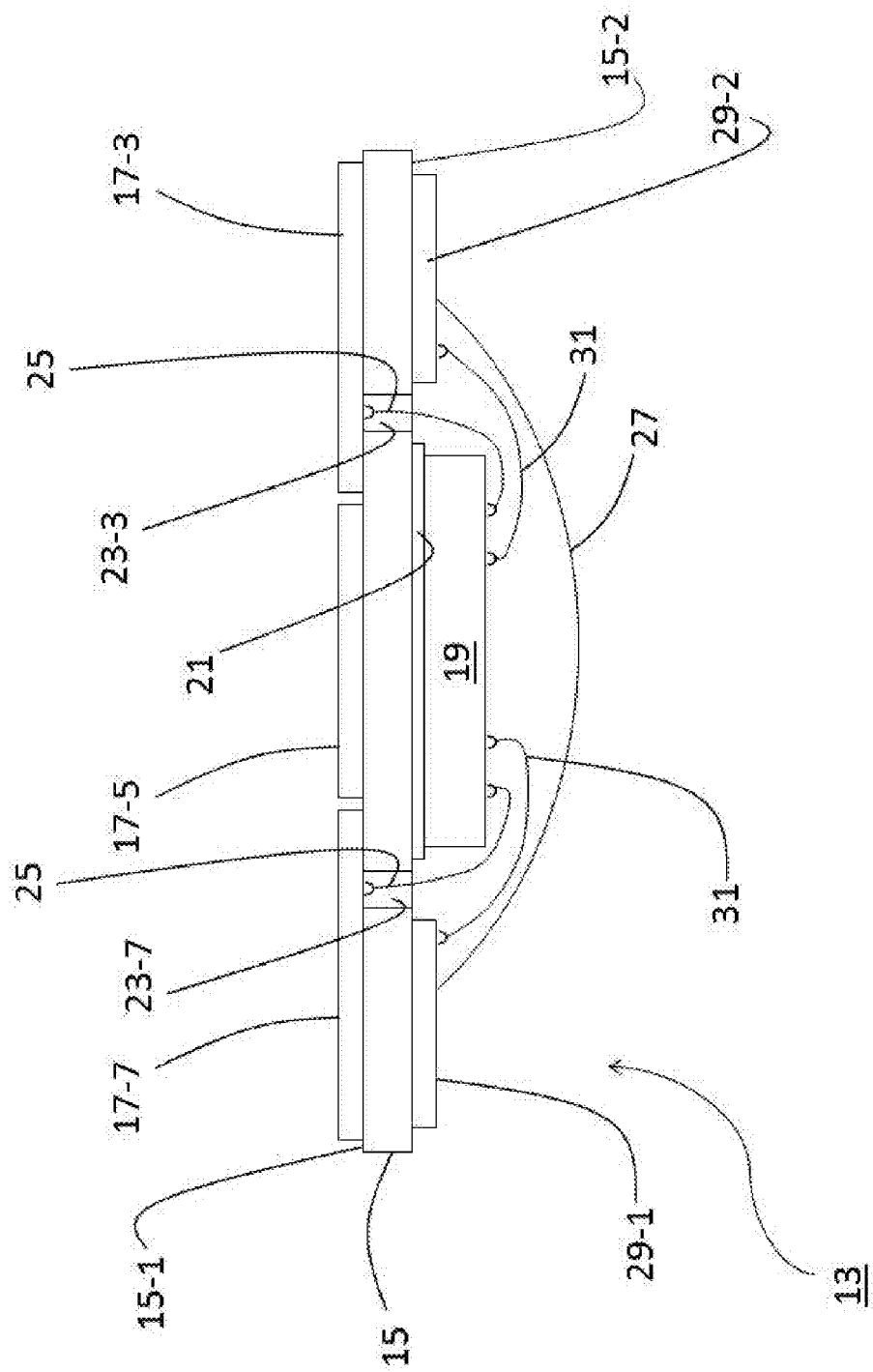
FIG. 2 is a simplified section view of one of the individual dual-interface IC modules shown in FIG. 1(b), taken along lines 2-2.
Figure 3A:
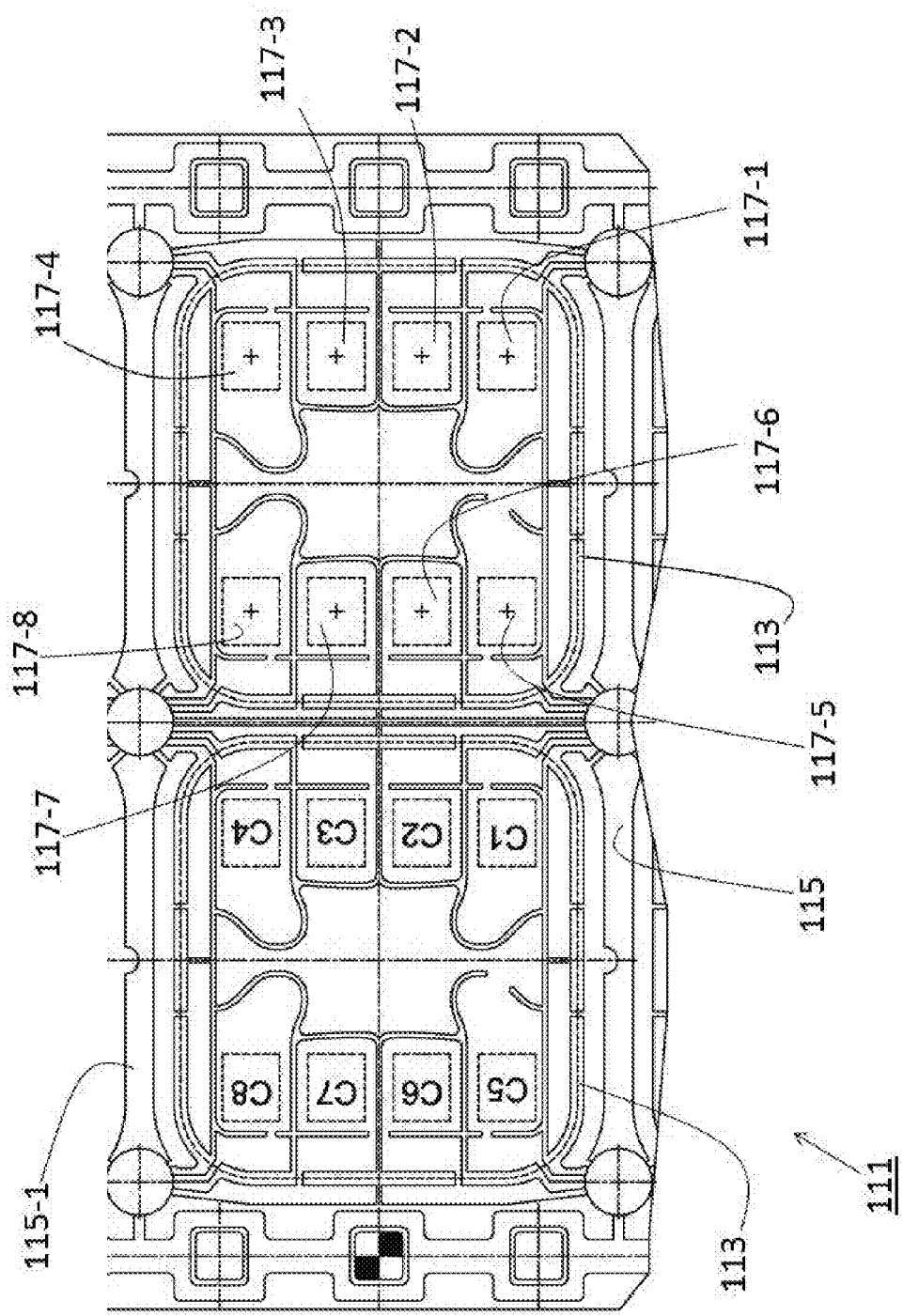
FIG. 3(a) is a fragmentary, top plan view of a segment of an IC module reel that includes a first embodiment of a plurality of individual dual-interface IC modules constructed according to the teachings of the present invention, the periphery of each dual-interface IC module being shown in dashed form.
Figure 3B:
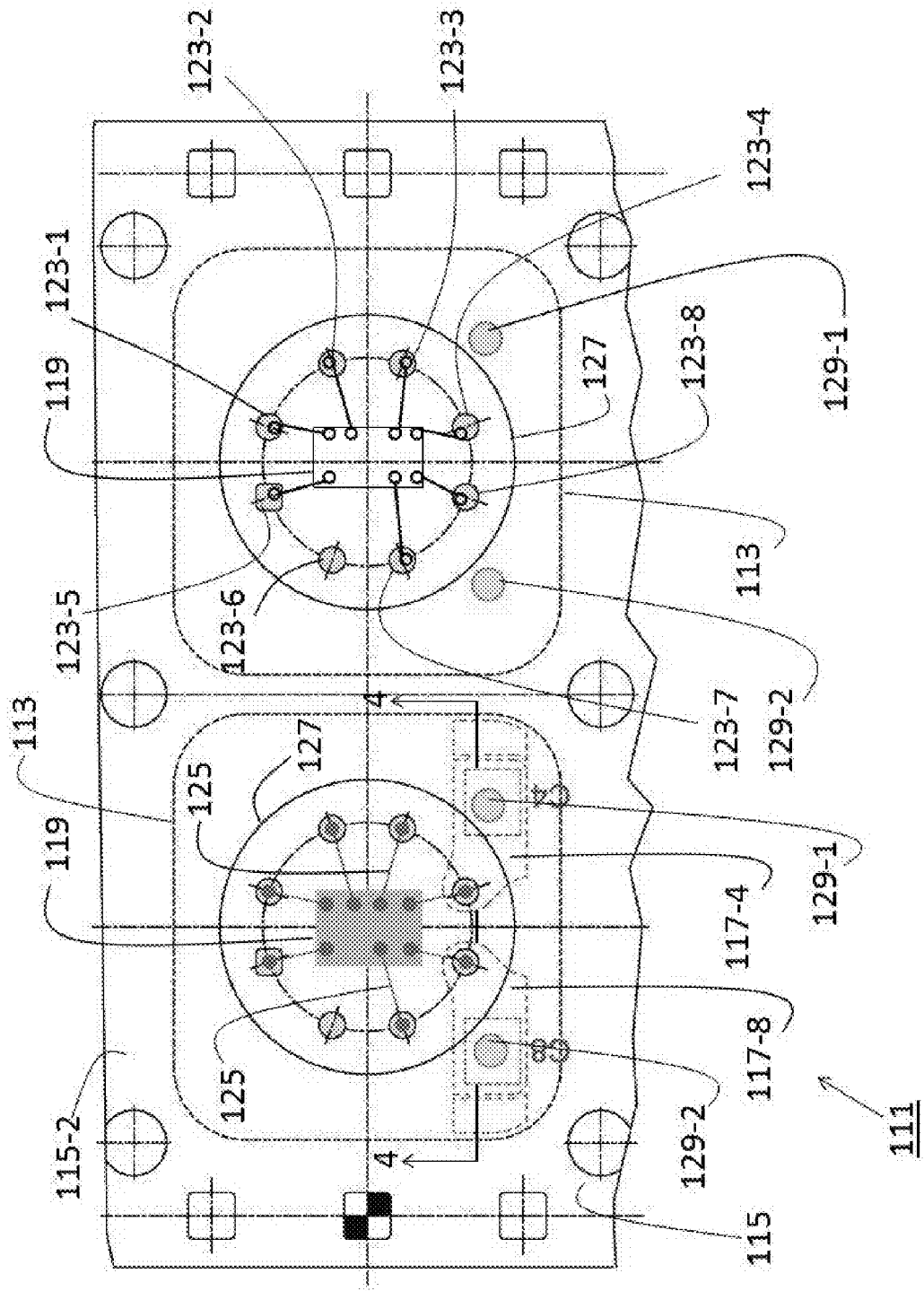
FIG. 3(b) is a fragmentary, bottom plan view of the segment of the IC module reel shown in FIG. 3(a), the periphery of each dual-interface IC module being shown in dashed form, the contact pads C4 and C8 for one of the individual dual-interface IC modules being shown in dashed form for ease in understanding the construction of the present invention.

Referring now to FIGS. 3(a) and 3(b), there is shown a segment of an IC module reel 111 that includes a first embodiment of a pair of individual dual-interface IC modules, each dual-interface IC module being constructed according to the teachings of the present invention and identified generally by reference numeral 113. As will be explained further in detail below, dual-interface IC module 113 utilizes a single side plated module tape construction. As a result, dual-interface IC module 113 is considerably less expensive to manufacture than traditional dual-interface IC modules that utilize a double side plated module tape construction.

In the description that follows, IC module 113 is shown and referenced in relation to the card body for a dual-interface smart card. However, it should be noted that IC module 113 is described in relation to the card body of a dual-interface smart card for illustrative purposes only. In fact, it is envisioned that IC module 113 could be utilized in additional applications without departing from the spirit of the present invention.

It should also be noted that individual IC modules 113 are described herein as being mass produced in pairs in a side-by-side relationship on a common reel 111 for ease of construction, with each module 113 being punched, or otherwise separated, from the remainder of reel 111 upon completion of assembly. However, it is to be understood that each IC module 113 could be constructed through an alternative manufacturing process (e.g. by individually constructing each IC module 113) without departing from the spirit of the present invention.

IC module reel 111 is similar to prior art reel 11 in that IC module reel 111 includes a module tape 115 that not only serves as the principal carrier for reel 111 but also serves as the substrate for each individual module 113. Tape 115 is preferably in the form of a thin, continuous, ribbon-type strip of a non-conductive material, such as a glass epoxy, that has a generally flat top surface 115-1 and a generally flat bottom surface 115-2.

Figure 4:
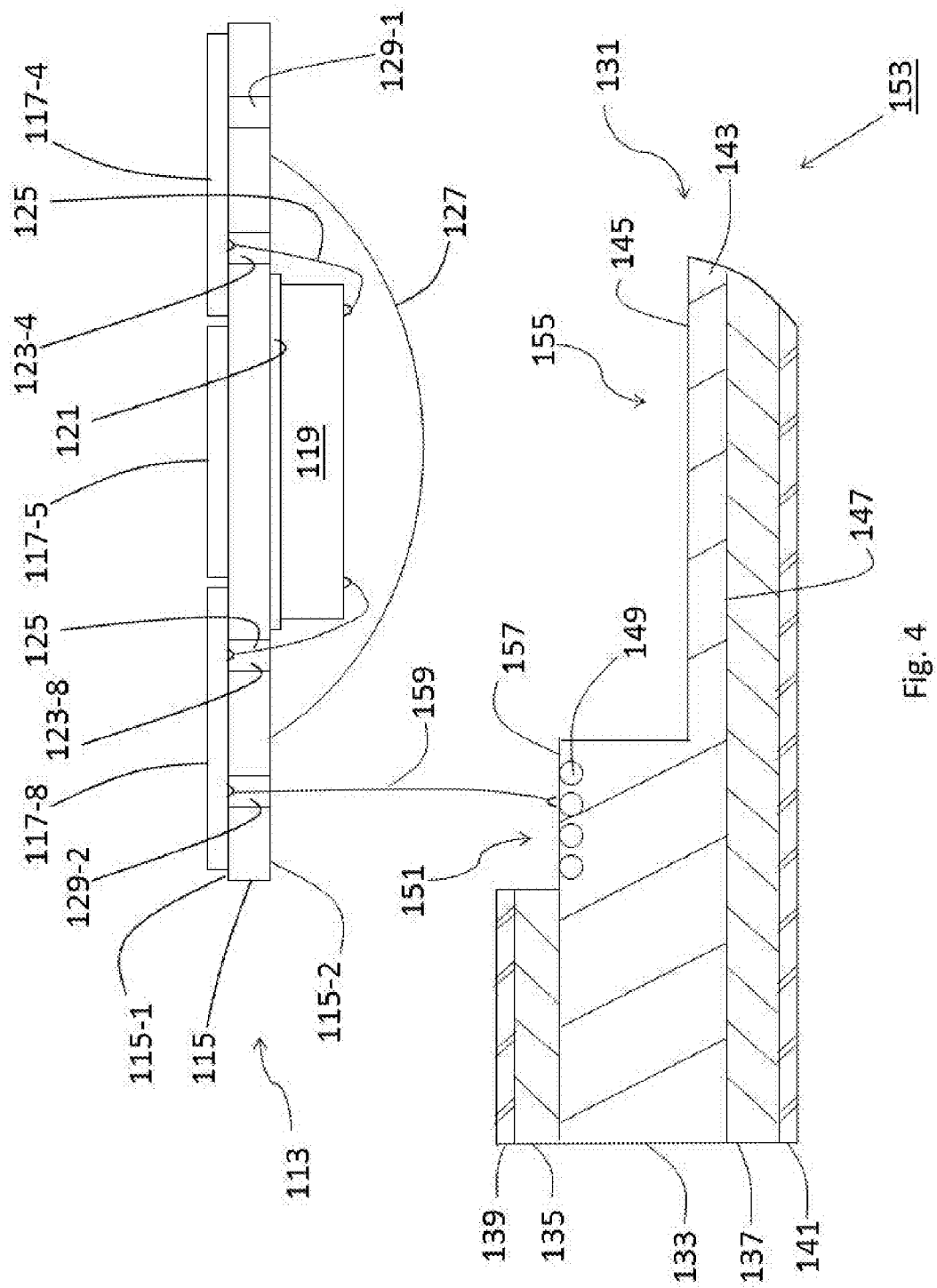
FIG. 4 is a simplified section view of one of the individual dual-interface IC modules shown in FIG. 3(b), taken along lines 4-4, the dual-interface IC module being shown in relation to the card body for a dual-interface smart card, the card body being shown in section.

As seen most clearly in FIGS. 3(a) and 4, top surface 115-1 of tape 115 is plated to define a plurality of separate contact pads 117-1 thru 117-8 within the footprint of each module 113, each contact pad 117 being constructed of a highly conductive material, such as gold-plated or nickel-plated copper. The particular size, shape and arrangement of contact pads 117 for each module 113 are largely defined by International Organization for Standardization (ISO) standards for the manufacture of smart cards and together provide a total surface area of approximately 1 square centimeter. For instance, the minimum footprint of each contact pad, as required by ISO standards, is represented in FIG. 3(a) in dashed form. In use, contact pads 117 enable each module 113 to interface with an appropriate card reader by means of direct contact, with certain contact pads 117 designated to transmit particular signal components (e.g. input/output signal, clock signal, ground, etc.).

In the present embodiment, each module 113 is provided with eight separate contact pads 117-1 thru 117-8, which are also identified herein as contact pads C1 thru C8, respectively. Based on ISO standards for the construction of smart cards, pad C1 is designated to connect with the supply voltage Vcc, pad C2 is designated to connect with the reset signal RST, pad C3 is designated to connect with the clock signal CLK, pad C5 is designated to connect to ground GND, and pad C7 is designated to connect with the input/output signal I/O.

It should be noted that, based on current industry standards for smart cards, contact pads C4, C6, and C8 are commonly designated as being reserved for future use (RFU). In other words, contact pads C4, C6, C8 are not typically required to deliver a particular signal to IC module 113 and, as such, remain unused in most dual-interface smart cards. As part of the present invention, unused contact pads C4 and C8 are utilized as antenna contact pads for a dual-interface smart card, as will be explained further in detail below.

IC module reel 111 is also similar to IC module reel 11 in that an integrated circuit chip 119 is preferably mounted on bottom surface 115-2 by an adhesive 121 at the approximate midpoint within the footprint of each module 113, as shown in FIGS. 3(b) and 4. An arrangement of holes 123-1 thru 123-8 is punched transversely through tape 115 in a spaced-apart, circular arrangement around IC chip 119. In this manner, holes 123-1 thru 123-8 are specifically positioned to provide direct access to the underside of contact pads 117-1 thru 117-8, respectively.

It should be noted that holes 123-1 thru 123-8 need not be configured in a circular arrangement. Rather, it is to be understood that holes 123-1 thru 123-8 could be arranged in any configuration that results in each hole 123 being directly aligned with its corresponding contact pad 117.

A conductive wire (e.g. a gold-plated wire) 125 is fed through selected holes 123 and bonded, at its ends, to IC chip 119 and each corresponding contact pad 117 to establish an electrical path therebetween. As a result, data stored on IC chip 119 can be transmitted through wires 125, to selected contact pads 117 and ultimately received by a card reader (not shown) in contact therewith.

It should be noted that the particular location of the contact terminals, or pads, on IC chip 119 to which wires 125 are bonded can vary by manufacturer. Accordingly, it is to be understood that the arrangement of holes 123 may be modified, as needed, to ensure that wires 125 do not cross one another or extend over IC chip 119.

An encapsulation material, or encapsulant, 127 is preferably deposited as a generally semi-spherical mass over IC chip 119 as well as any wires 125. Encapsulant 127 is preferably constructed of a rigid and durable material, such as a hard epoxy resin, that serves to protect the relatively sensitive electrical components and ensure that adequate connectivity is maintained.

Although useful in protecting IC chip 119 and wires 125, encapsulant 127 is not essential to the construction of IC module 113 and could be eliminated, if desired. Additionally, it is to be understood that encapsulant 127 is not limited to a circular footprint, as shown herein, but rather could be in the form of an alternative shape that is determined largely by the ultimate location of holes 123.

As a principal feature of the present invention, IC module reel 111 differs from IC module reel 11 in that IC module reel 111 is not plated on bottom surface 115-2 to define a pair of contact pads for use in connecting each IC module 113 to an antenna embedded in the card body for a dual-interface smart card. Rather, by eliminating plating on bottom surface 115-2, IC module 113 can be constructed at a considerably lower cost that prior art module 13.

IC module 113 achieves connection to an antenna embedded in the card body for a dual-interface smart card through the use of unused contact pads C4 and C8. Specifically, as seen most clearly in FIGS. 3(b) and 4, an additional pair of holes 129-1 and 129-2 is punched transversely through tape 115 outside of encapsulant 127 but within the region of contact pads 117-4 and 117-8, respectively. In this manner, the underside of unused contact pads 117-4 and 117-8 are rendered externally exposed and can therefore be used to facilitate connection of an antenna in the card body for a dual-interface smart card to IC module 113.

In the present embodiment, each hole 129 is represented as being generally circular in transverse cross-section. However, it is to be understood that each hole 129 could be reconfigured in any size and/or shape that serves as a suitable contact surface, so long as hole 129 is adequately spaced a predefined distance in from the periphery of tape 115. For instance, each hole 129 could have an enlarged, rectangular shape in transverse cross-section to more closely conform to the shape of a conventional antenna contact pad (e.g. prior art pad 29).

Referring now to FIG. 4, IC module 113 is shown in relation to a conventional card body 131 for a dual-interface smart card. As can be seen, card body 131 is preferably constructed by laminating together multiple enlarged sheets of durable plastic material, such as polyvinyl chloride (PVC), acrylonitrile butadiene styrene (ABS), or polycarbonate. The resultant laminated product is then punched, stamped, or otherwise cut to form a card body 131 of the required dimensions.

Card body 131 is represented herein as comprising a radio frequency (RF) inlay 133 that is disposed between a top plastic layer 135 and a bottom plastic layer 137, each of layers 135 and 137 preferably being printed to provide card body 131 with the proper aesthetic components. In addition, a pair of opposing, transparent, plastic overlays 139 and 141 is disposed on the top and bottom surfaces, respectively, of the stack. As noted above, inlay 133 and layers 135, 137, 139 and 141 are then permanently joined together by any suitable means, such as through a lamination process, to yield unitary card body 131.

As previously referenced, the particular construction of card body 131 is provided herein solely for illustrative purposes. It is to be understood that card body 131 could include an alternative number and arrangement of layers without departing from the spirit of the present invention.

RF inlay 133 includes a core layer, or substrate, 143 that includes a substantially flat top surface 145 and a substantially flat bottom surface 147. A radio frequency (RF) antenna 149 is permanently incorporated into core layer 143.

In the present example, antenna 149 is represented as a conductive wire that is embedded into top surface 145 of core layer 143 about its periphery in a generally coiled or spiraled configuration. The free ends of antenna 149 are preferably densely arranged to form a pair of appropriately configured contact terminals 151, with only one contact terminal being shown herein for ease of illustration.

As can be appreciated, antenna 149 is electrically coupled to IC module 113 to produce a dual-interface smart card 153 with RF transmission capabilities. In order to directly connect antenna 149 to IC module 113, a cavity 155 is milled into the otherwise planar card body 131. As can be seen, cavity 155 is dimensioned to receive IC module 113, with the periphery of cavity 155 shaped to define a narrow shelf, or mounting surface, 157 that supports IC module 113.

Preferably, the peripheral portion of cavity 155 is formed at a depth that lies in the plane defined by the top surface of the individual windings that form antenna 149. In this manner, the portion of antenna 149 that forms contact terminals 151 is rendered externally exposed for direct connection with IC module 113 without any damage being imparted thereto.

To achieve functionality of smart card 153, IC module 113 needs to be coupled to antenna 149. Most commonly, IC module 113 is connected to antenna 149 through direct connection.

In the present embodiment, direct connection is achieved by bonding one end of a conductive element 159 (e.g. a wire, conductive epoxy or combination thereof) to the underside of each of unused contact pads 117-4 and 117-8 and the other end of the same conductive element 159 to a corresponding contact terminal 151 for antenna 149. Although not shown herein, it is to be understood that particular means for directly connecting contact pads 117 on IC module 113 to contact terminals 151 for antenna 149 could rely upon certain direct connection techniques that are known in the art, such as direct connection techniques described in U.S. Pat. No. 8,640,965 to C. M. Sutera and U.S. Pat. No. 6,881,605 to C. K. Lee.

Through the above-described technique, direct connection can be established between IC chip 119 and antenna 149 without utilizing a double side plated tape construction. Specifically, a signal to be wirelessly transmitted by antenna 149 is delivered from IC chip 119 to contact pads C4 and C8 by conductive wires 125, the entirety of IC chip 119 and wires 125 being preferably enveloped by encapsulate 127 to preserve adequate connectivity. The wireless signal then travels along the entirety of contact pads 117-4 and 117-8 and is ultimately delivered to antenna 149 by conductive elements 159, which are located outside of encapsulate 127. As a result, an electrical connection path is established between antenna 149 in card body 131 and IC module 113 without requiring any plating on bottom surface 115-2 of tape 115. Consequently, dual-interface smart card 153 is considerably less expensive to construct than conventional dual-interface smart cards, which is a principal object of the present invention.

The embodiments shown above are intended to be merely exemplary and those skilled in the art shall be able to make numerous variations and modifications to it without departing from the spirit of the present invention. All such variations and modifications are intended to be within the scope of the present invention as defined in the appended claims.

In particular, it is envisioned that alternative types of IC modules intended for use in dual-interface smart cards could be designed using a single side plated tape construction. Most notably, it is to be understood that by punching transverse holes through a single side plated module tape in alignment with unused upper contact pads in the region outside of the chip encapsulant, the exposed underside of each unused upper contact pad can be used as a contact surface for conductively coupling the IC module to an antenna, thereby effectively eliminating the need for plating an additional set of antenna contact pads on the bottom surface of the module tape.

Figure 5A:
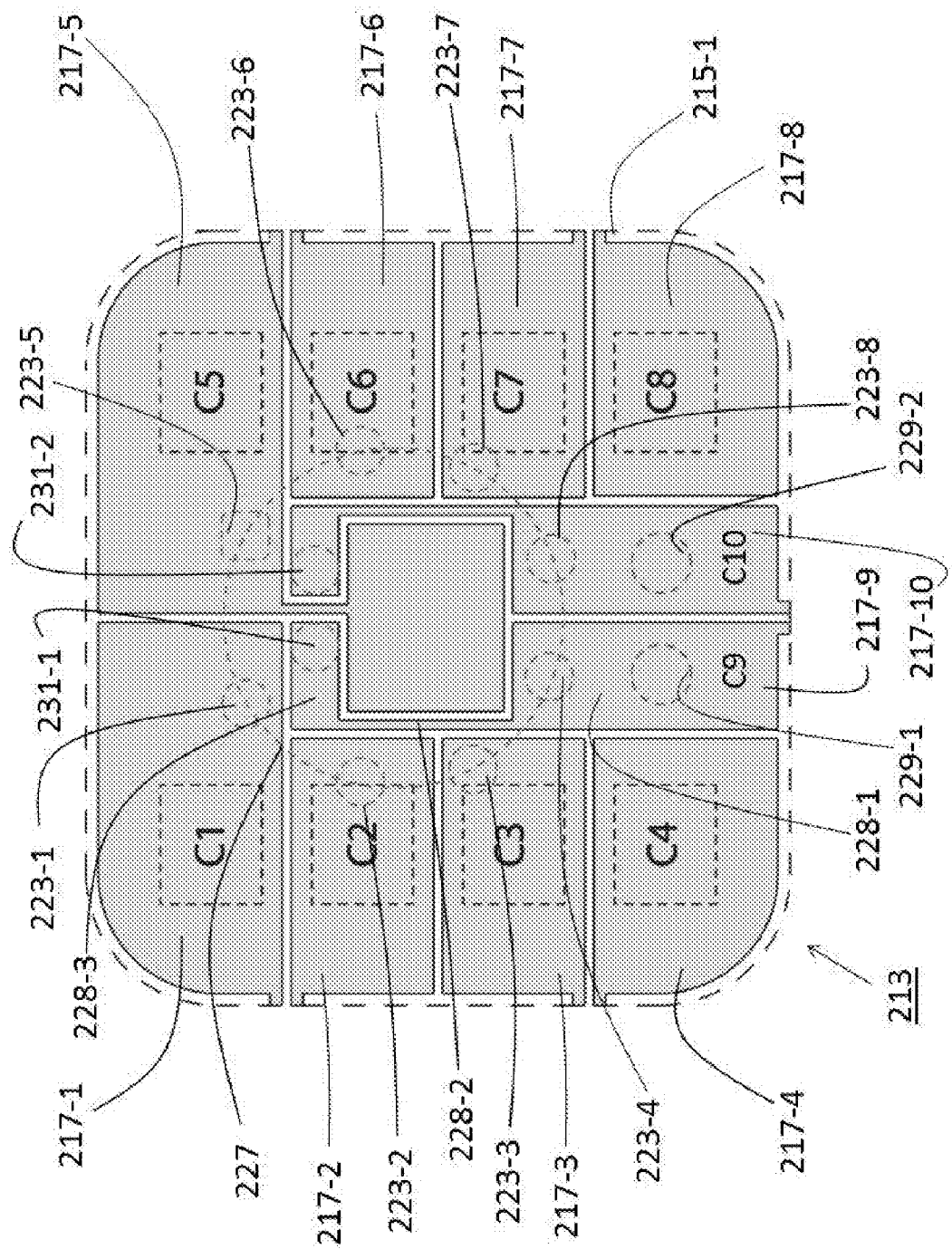
FIG. 5(a) is a top plan view of a second embodiment of a dual-interface IC module constructed according to the teachings of the present invention, the transverse holes punched through the module tape being shown in dashed form for ease in understanding the construction of the present invention.
Figure 5B:
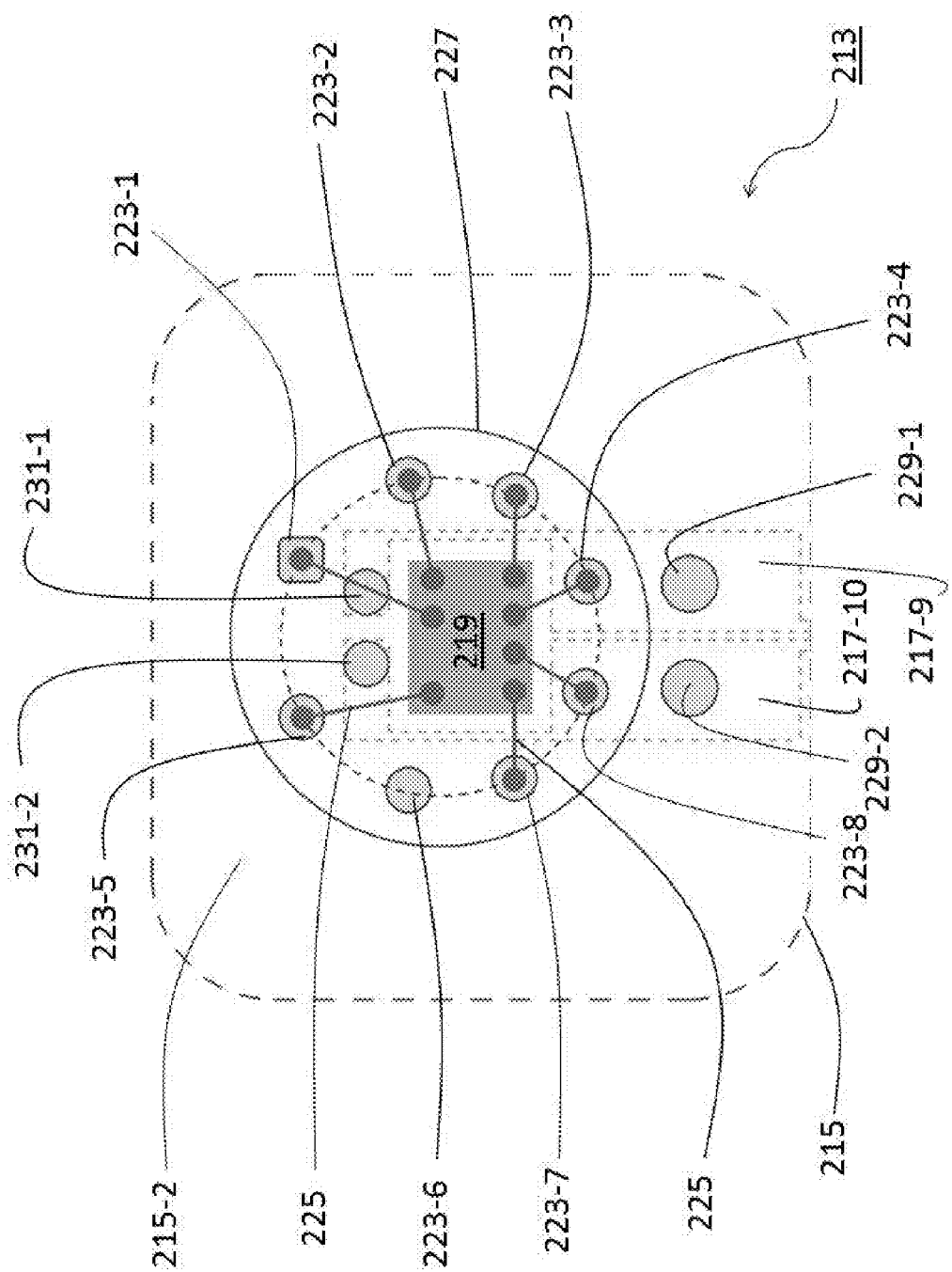
FIG. 5(b) is a bottom plan view of the dual-interface IC module shown in FIG. 5(a), the contact pads C9 and C10 being shown in dashed form for ease in understanding the construction of the present invention.

For instance, referring now to FIGS. 5(a) and 5(b), there is shown a second embodiment of a dual-interface IC module that is constructed according to the teachings of the present invention and identified generally by reference numeral 213. As will be explained further in detail below, dual-interface IC module 213 is similar to IC module 113 in that IC module 213 utilizes a single side plated module tape construction. As a result, dual-interface IC module 213 is considerably less expensive to manufacture than traditional dual-interface IC modules that utilize a double side plated module tape construction.

In particular, IC module 213 is similar to IC module 113 in that IC module 213 includes a module tape 215 formed as a thin, continuous, ribbon-type strip of a non-conductive material, such as a glass epoxy, that has a generally flat top surface 215-1 and a generally flat bottom surface 215-2. As seen most clearly in FIG. 5(a), top surface 215-1 of tape 215 is plated to define a plurality of separate contact pads 217, each contact pad 217 being constructed of a highly conductive material, such as gold-plated or nickel-plated copper.

IC module 213 is also similar to IC module 113 in that an integrated circuit chip 219 is preferably mounted on bottom surface 215-2 by an adhesive (not shown) within the footprint of module 213, as shown in FIG. 5(b). A first set of holes 223-1 thru 223-8 is punched transversely through tape 215 in a spaced-apart, generally circular arrangement around IC chip 219. In this manner, holes 223-1 thru 223-8 are specifically positioned to provide direct access to the underside of corresponding contact pads 217.

However, as with IC module 113, it should be noted that holes 223-1 thru 223-8 in module tape 215 need not be arranged in a generally circular arrangement. Rather, it is to be understood that holes 223-1 thru 223-8 could be arranged in any suitable configuration that results in each individual hole 223 being directly aligned with it corresponding contact pad. In fact, as will be explained further below, the location of holes 223 may be largely determined based upon the corresponding location of the available contact terminals, or pads, on IC chip 219.

A conductive wire (e.g. a gold-plated wire) 225 is fed through selected holes 223 and bonded, at its ends, to IC chip 219 and each corresponding contact pad 217 to establish an electrical path therebetween. As a result, data stored on IC chip 219 can be transmitted through wires 225, to selected contact pads 217 and ultimately received by a card reader (not shown) in contact therewith.

An encapsulation material, or encapsulant, 227 is preferably deposited as a generally semi-spherical mass over IC chip 219 as well as any wires 225. Encapsulant 227 is preferably constructed of a rigid and durable material, such as a hard epoxy resin, that serves to protect the relatively sensitive electrical components and ensure that adequate connectivity is maintained.

Although useful in protecting IC chip 219 and wires 225, encapsulant 227 is not essential to the construction of IC module 213 and could be eliminated, if desired. Additionally, it is to be understood that encapsulant 227 is not limited to a circular footprint, as shown herein, but rather could be in the form of an alternative shape that is determined largely by the ultimate location of holes 223 (e.g. a generally D-shaped footprint).

IC module 213 differs primarily from IC module 113 in the number and arrangement of contact pads 217 on top surface 215-1 of module tape 215. Specifically, as seen most clearly in FIG. 5(a), top surface 215-1 of module tape 215 is plated so as to define ten separate contact pads 217-1 thru 217-10, which are also identified herein as contact pads C1 thru C10, respectively. As will be explained further below, the addition of contact pads 217-9 and 271-10 provides antenna connection capabilities to IC module 213 without requiring plating on bottom surface 215-2 of module tape 215, which is a principal object of the present invention.

Contact pads 217-1 thru 217-8 are similar in arrangement and designated function to contact pads 117-1 thru 117-8, respectively, of IC module 113, with the minimum footprint of each contact pad 217, as required by ISO standards, being represented in dashed form. Specifically, pads 217-1 thru 217-8 are arranged as two vertically oriented columns of pads that are symmetrical about its vertical axis, with pad 217-1 designated to connect with the supply voltage Vcc, pad 217-2 designated to connect with the reset signal RST, pad 217-3 designated to connect with the clock signal CLK, pad 217-5 designated to connect to ground GND, and pad 217-7 designated to connect with the input/output signal I/O. Furthermore, based on current industry standards, contact pads 217-4, 217-6, and 217-8 are preferably designated as being reserved for future use (RFU).

As referenced above, IC module 213 includes two additional contact pads 217-9 and 217-10 that are designated purely for use as contact surfaces for conductively coupling IC module 213 to an antenna (e.g. antenna 149). The inclusion of pads C9 and C10 into IC module 213 is achieved largely by (i) reducing the footprint of IC chip 219 (as well as the corresponding center portion of ground pad C5) and (ii) slightly modifying the geometry (i.e. reducing the width) of contact pads C4 and C8.

It should be noted that the reduction in size of IC chip 219 (and, in turn, the reduction in size of the center portion of ground pad C5) is possible due to advancements in the manufacture of integrated circuits. For instance, integrated circuit chips of the type that are traditionally used in smart cards have a footprint as large as 5 mm by 8 mm in size. However, current advances in integrated circuit design enable the size of the integrated circuit chip to be reduced to a footprint as small as 2 mm by 2 mm in size. Examples of reduced-size integrated circuit chips for use in dual-interface smart cards include the ST31G480 model smart card microcontroller manufactured by STMicroelectronics N.V., of Geneva, Switzerland and the P5CD081 model smart card microcontroller manufactured by NXP Semiconductors N.V., of Eindhoven, Netherlands.

Because ISO standards require the total surface area of contact pads 217 to remain a defined size (approximately 1 square centimeter), this reduction in the IC chip size allows for greater flexibility in modifying the interior geometry of certain contact pads 217. Accordingly, contact pads 217-9 and 217-10 extend vertically within the bottom center portion of IC module 213 as generally rectangular tracks arranged in a side-by-side relationship.

As seen most clearly in FIG. 5(a), each of contact pads 217-9 and 217-10 includes an enlarged, rectangular bottom portion 228-1 that extends vertically upward from the center, bottom edge of module 213 between pads C3, C4, C7 and C8 to a location spaced slightly away from IC chip 219. A thin, narrower side portion 228-2 continues vertically upward from each portion 228-1 and extends along a corresponding side of IC chip 219 in a close, spaced apart relationship relative thereto. The distal end of each side portion 228-2 terminates into an enlarged, tabular top portion 228-3 located beneath contact pads C1 and C5, respectively, and directly above IC chip 219 in close proximity thereto. Due to its overall, generally C-shaped configuration, each of contact pads 217-9 and 217-10 is able to wrap, or conform, around three sides of IC chip 219. This design enables contact pads C9 and C10 to be easily connected to IC chip 219, as will be explained further below.

It should also be noted that the resultant size, shape and arrangement of contact pads 217 is rendered in compliance with International Organization for Standardization (ISO) standards for the manufacture of smart cards, since the geometry of contact pads 217-1 thru 217-8 still meet the necessary size and location requirements (e.g. the minimum required footprint of each pad 217, as designated in dashed form).

As mentioned above, contact pads 217-9 and 217-10 are designated for use as antenna contact pads for connecting IC module 213 to an antenna embedded in a card body (e.g. card body 131) to yield a dual-interface smart card. IC module 213 is able to connect to an antenna embedded in the card body for a dual-interface smart card by punching a first pair of holes 229-1 and 229-2 through tape 215 outside the region of encapsulant 227 but within the bottom portion 228-1 of region of contact pads 217-9 and 217-10, respectively.

It should be noted that first pair of holes 229-1 and 229-2 is preferably spaced a defined distance in from the bottom edge of module tape 215, as required by industry standards. To accommodate this space requirement, IC chip 219 is mounted in an offset fashion in relation to the center of module tape 215. Specifically, IC chip 219 is mounted slightly above the center of module 213 (i.e. towards top edge of module tape 215, in the direction of pads C1 and C5) in order to meet the necessary requirements of the module design.

In the present embodiment, each antenna connection hole 229 is represented as being generally circular in transverse cross-section. However, it is to be understood that each hole 229 could be reconfigured in any size and/or shape that serves as a suitable contact surface, so long as hole 229 is adequately spaced a predefined distance in from the periphery of tape 215. For instance, each hole 229 could have an enlarged, rectangular shape in transverse cross-section to more closely conform to the shape of a conventional antenna contact pad (e.g. prior art pad 29).

Because contact pads 217-4 and 217-8 are not designed for use, holes 223-4 and 223-8 are preferably aligned with bottom portion 228-1 of contact pads 217-9 and 217-10, respectively, in close proximity to IC chip 219 (preferably, within the region of encapsulant 227). Accordingly, holes 223-4 and 223-8 enable antenna-designated contact pads C9 and C10 to be connected to IC chip 219 by corresponding wires 225 (i.e. contact pads C4 and C8 are not connected to IC chip 219).

In the present embodiment, an additional pair of holes 231-1 and 231-2 is punched transversely through tape 215 within top portion 228-3 of contact pads C9 and C10, respectively, in close proximity to IC chip 219. Holes 231-1 and 231-2 are aligned on opposite sides of IC chip 219 from holes 223-4 and 223-8, respectively. This provides flexibility in connecting contact pads 217-9 and 217-10 to IC chip 219 by wires 225, as certain IC chips are designed with available connection pads at certain locations and other IC chips are designed with available connection pads at other locations. By providing a first set of holes 231-1 and 231-2 on one side of IC chip 219 and a second set of holes 223-4 and 223-8 on the other side of IC chip 219, the particular set of holes ultimately utilized to connect contact pads 217-9 and 217-10 to IC chip 219 can be selected based on the availability of connection pads on IC chip 219. As a result, connection between contact pads 217-9 and 217-10 can be achieved with IC chip 219 without crossing any wire 225 over IC chip 219 or into contact with another wire 225, both of the aforementioned conditions being considered undesirable in the art.

As referenced above, the underside of designated antenna contact pads 217-9 and 217-10 is rendered externally exposed via holes 229-1 and 229-2, respectively. As a result, connection can be established between IC module 213 and the card body for a dual-interface smart card (e.g. card body 131) by connecting a conductive element (e.g. a wire) to the exposed underside of each of contact pads 217-9 and 217-10 and, in turn, to the antenna embedded in the card body.

What is claimed is:

1. An integrated circuit module for a dual-interface smart card, comprising:
    (a) a non-conductive module tape having a top surface and a bottom surface, the non-conductive module tape being transversely punched to define a first hole and a second hole, the first and second holes being mutually exclusive;
    (b) a first conductive contact pad plated on the top surface of the module tape, wherein the entirety of the bottom surface of the module tape is in the absence of a conductive pad plated thereon;
    (c) an integrated circuit chip coupled to the bottom surface of the module tape, the integrated circuit chip having multiple sides; and
    (d) a conductive element extending through the first hole and electrically connecting the integrated circuit chip to the first contact pad;
    (e) wherein the second hole exposes a portion of the first contact pad as a surface for establishing electrical connection to the integrated circuit chip.

2. The integrated circuit module as claimed in claim 1, further comprising an encapsulating material deposited on the bottom surface of the module tape over the integrated circuit chip and the conductive element which connects the first contact pad to the integrated circuit chip.

3. The integrated circuit module as claimed in claim 2 wherein the second hole extends through the module tape at a location outside the encapsulating material.

4. The integrated circuit module as claimed in claim 1 wherein the first contact pad is adapted to direct connect to an antenna through the second hole in order to wirelessly transmit a signal from the integrated circuit chip.

5. The integrated circuit module as claimed in claim 4 wherein the integrated circuit module includes a second contact pad plated on the top surface of the module tape, the second contact pad being in electrical connection with the integrated circuit chip, the second contact pad being adapted to transmit a signal from the integrated circuit chip through direct contact.

6. The integrated circuit module as claimed in claim 5 wherein the module tape is transversely punched to define a third hole separate from the first and second holes, each of the first, second and third holes exposing a portion of the first contact pad.

7. The integrated circuit module as claimed in claim 1 wherein the first contact pad extends along at least a portion of three of the multiple sides of the integrated circuit chip.

8. A dual-interface smart card, comprising:
    (a) a card body comprising an antenna;
    (b) an integrated circuit module comprising,
        (i) a non-conductive module tape having a top surface and a bottom surface, the non-conductive module tape being transversely punched to define a first hole and a second hole, the first and second holes being mutually exclusive,
        (ii) a first conductive contact pad plated on the top surface of the module tape, wherein the entirety of the bottom surface of the module tape is in the absence of conductive contact pads plated thereon,
        (iii) an integrated circuit chip coupled to the bottom surface of the module tape, and
        (iv) a first conductive element extending through the first hole and electrically connecting the integrated circuit chip to the first contact pad; and
    (c) a second conductive element extending through the second hole in the module tape and electrically connecting the antenna in the card body to the first contact pad.

9. The dual-interface smart card as claimed in claim 8 further comprising an encapsulating material deposited on the bottom surface of the module tape over the integrated circuit chip and the first conductive element which connects the first contact pad to the integrated circuit chip.

10. The dual-interface smart card as claimed in claim 8 wherein the integrated circuit module includes a second contact pad plated on the top surface of the module tape, the second contact pad being in electrical connection with the integrated circuit chip, the second contact pad being adapted to transmit a signal from the integrated circuit chip through direct contact.

11. The dual-interface smart card as claimed in claim 8 wherein the card body comprises an antenna embedded within at least one plastic layer.

12. The dual-interface smart card as claimed in claim 11 wherein the card body is shaped to define a cavity dimensioned to receive the integrated circuit module.

13. The dual-interface smart card as claimed in claim 12 wherein the cavity is dimensioned to externally expose a portion of the antenna.

14. An integrated circuit module for a dual-interface smart card, comprising:
   (a) a non-conductive module tape having a top surface and a bottom surface;
   (b) a plurality of conductive contact pads plated on the top surface of the module tape, wherein the entirety of the bottom surface of the module tape is in the absence of a conductive contact pad plated thereon; and
   (c) an integrated circuit chip coupled to the bottom surface of the module tape, the integrated circuit chip being electrically connected to each of the plurality of conductive contact pads by a conductive element; and
   (d) an encapsulating material deposited on the bottom surface of the module tape over the integrated circuit chip and the conductive element which connects each contact pad to the integrated circuit chip;
   (e) wherein at least one hole extends transversely through the module tape at a location outside the encapsulating material, the at least one hole exposing at least one of the plurality of contact pads as a surface for establishing electrical connection to the integrated circuit chip.

15. The integrated circuit module as claimed in claim 14 wherein the integrated circuit chip is bonded to the bottom surface of the module tape by an adhesive.

16. The integrated circuit module as claimed in claim 15 wherein the conductive element that connects each contact pad to the integrated circuit chip penetrates through a corresponding transverse hole formed in the module tape at a location within the encapsulating material.

* * * * *